United States Patent [19]

Bersin

[11] 3,923,568

[45] Dec. 2, 1975

[54] DRY PLASMA PROCESS FOR ETCHING NOBLE METAL

[75] Inventor: Richard L. Bersin, Kensington, Calif.

[73] Assignee: International Plasma Corporation, Hayward, Calif.

[22] Filed: Jan. 14, 1974

[21] Appl. No.: 432,953

[52] U.S. Cl. .................... 156/8; 156/18; 252/79.1

[51] Int. Cl.$^2$ .................... C23F 1/00

[58] Field of Search .................. 156/17, 18, 4, 8, 3; 96/36.2; 134/1; 204/164, 169, 192; 117/212; 148/6.3; 357/71; 252/79.1

[56] References Cited

UNITED STATES PATENTS

| | | | |
|---|---|---|---|
| 3,791,952 | 2/1974 | Labuda et al. | 204/192 |
| 3,795,557 | 3/1974 | Jacob | 156/17 |
| 3,806,365 | 4/1974 | Jacob | 96/36.2 |
| 3,867,216 | 2/1975 | Jacob | 252/79.1 |

*Primary Examiner*—Douglas J. Drummond
*Assistant Examiner*—Jerome W. Massie
*Attorney, Agent, or Firm*—Flehr, Hohbach, Test, Albritton & Herbert

[57] ABSTRACT

There is disclosed a process for etching noble metals, particularly for removing selected areas of thin films of electrically conductive noble metals, by contacting exposed areas of noble metal with a plasma that must include both fluorine and chlorine and may, optionally, also contain oxygen.

10 Claims, No Drawings

DRY PLASMA PROCESS FOR ETCHING NOBLE METAL

BACKGROUND OF THE INVENTION

In the process of making printed circuits and particularly microcircuit chips it is desirable to provide a substrate such as silicon or silicon dioxide with a printed circuit of a highly electrically conductive noble metal such as gold or platinum. These articles are usually manufactured by providing the substrate with a very thin film of the appropriate noble metal, covering the film of noble metal with a film of photoresist, then exposing the photoresist by photographic techniques to the ultimate pattern desired for the noble metal circuit and then removing either the exposed or the unexposed portion of the photoresist to uncover the portion of the noble metal film to be removed. The article is then contacted with a suitable chemical material that will attack the noble metal but will not attack the remaining portions of the film of photoresist whereby the noble metal is removed selectively in the areas where it is not needed and a circuit remains.

Many problems are associated with the process described above. These include the need to use very aggressive acids to dissolve noble metals. These acids are dangerous to store and use and difficult to dispose of. The strong acids also undercut the noble metal beneath the photoresist film, and it is difficult to control and terminate the etching process.

THE INVENTION

This invention overcomes or greatly mitigates the problems associated with prior etching processes. In its broadest sense this invention provides a process for etching a noble metal by contacting it with a plasma of chlorine and fluorine, and, desirably, oxygen for a time sufficient to remove the desired amount of noble metal. The invention also includes a process for producing a pattern of a thin film of noble metal disposed on a substrate by providing a thin film of noble metal on a substrate, covering the film of noble metal with a suitable resist in the form of the desired pattern of noble metal and then contacting the surface with a plasma of chlorine, fluorine and, desirably, oxygen.

Although plasmas are not clearly understood, it is known that a special form of chemical materials can be made by exposing compounds to high energy radio frequencies. Under the influence of these radio frequencies, compounds break down and rearrange to form transitory species with life spans so short that they are difficult to identify. Accordingly, unexpected reactions can be effected in a plasma that are difficult or impossible to effect using more conventional techniques. The present invention is one such unexpected reaction.

It was discovered that a plasma consisting essentially of chlorine and fluorine will etch noble metals that are not attacked by known compounds of chlorine and fluorine. It was also discovered that oxygen in the plasma has a catalytic effect which accelerates the removal of noble metals. The plasma must exclude species that are detrimental to the photoresist or to the action of the plasma on the noble metal, but it may include innocuous species. It was found that hydrogen must be excluded from the plasma whether molecular or combined in such forms as water or hydrocarbons. On the other hand carbon is innocuous as are species such as helium and other inert gases. As stated above, the actual species existing in the plasma are not known, and only the known compounds from which the plasma is made can be identified. The use of innocuous materials, such as helium, can be employed beneficially when it is desired to reduce the effective pressure of the active chlorine and fluorine elements.

In the present invention ordinary plasma-generating equipment may be employed. Typical of such equipment are the devices described in U.S. Pat. No. 3,573,192. It is preferred to employ a quartz chamber in effecting the process of this invention to avoid etching of a glass chamber with fluorine.

The process of this invention is preferably effected at very low absolute pressure. A pressure lower than 0.2 torr is preferred although higher pressures are useful. In general, lower pressures produce better resolution of the etched pattern while higher pressures effect etching more rapidly. Accordingly, where good resolution is not important, a higher pressure is preferred; and where good resolution is desired, a lower pressure is preferred. It is also preferred to maintain a dynamic gas system within the reaction chamber by continuously evacuating the chamber and continuously bleeding fresh gas into it.

Although virtually any manner for supplying chlorine and fluorine to the reaction chamber may be used, best results are obtained when the chlorine and fluorine are in the same molecule. Accordingly, chlorofluorocarbons, known commercially as Freons, are the preferred source of chlorine and fluorine to the reaction chamber. It is preferred that compounds be used having an atomic ratio of chlorine to fluorine of from 1:3 to 3:1 and more preferably about 1:1. Compounds such as $CCl_2F_2$ or $C_2Cl_3F_3$ are preferably used. Chlorofluorocarbons such as $c_2ClF_5$ will effect etching of noble metals, but the etching is so slow that unwanted side reactions, such as attacks on photoresists, are more prevalent.

The use of mixtures such as $CCl_4$ and $CF_4$ can also effect etching, but control over the atomic ratios of chlorine and fluorine is difficult. Elemental chlorine and fluorine may also be used, but the corrosive nature of these materials and the difficulty of maintaining atomic ratios within the reaction chamber discourage use of such mixtures.

As stated above, oxygen is useful in the reaction chamber. Oxygen is not essential to the plasma of chlorine and fluorine used to etch noble metals, but the reaction proceeds at a significantly faster rate with oxygen present. The amount of oxygen present should be at least 5% by volume, but excessive amounts should be avoided because it tends to attack the photoresist. Very small amounts of oxygen such as 1% by volume have a small but discernable effect on the reaction rate, but about 20 % by volume of oxygen is usually employed. Oxygen in the amount of from 10v to 25%v is preferred.

This invention is particularly useful to etch gold and platinum films because those metals are so resistant to attack by conventional etching media. However, the invention can be used as well to remove tantalum, palladium, chromium, nickel, silver and other metals usually referred to as noble metals.

Whatever chemical species are produced in the plasma, they do not destroy the organic photoresist compounds normally used in this type of work. As stated above, too much oxygen in the plasma will deteriorate the photoresist, but it will remain intact in the presence of a chlorinefluorine plasma containing less than 25%v oxygen. The photoresist will frequently darken or become reticulated after exposure but will remain a suitable shield for the metal beneath it unless exposed for unduly long periods to the plasma. Photoresist deterioration is probably due more to heat than to chemical attack. Although the term photoresist is employed throughout this description, any resist that is organic and can be deployed in a pattern over a noble metal film can be used. Photoresists are usually used because photographic techniques are so convenient for producing a pattern, especially a very small one. Typical photoresists are a product of the Shipley Company known as AZ 1350 H and a product of the Hunt Chemical Company known as Waycoat IC. Photoresists used in accordance with this invention are selected, applied, photographically exposed and removed according to conventional techniques. The thin films of noble metal that the photoresists partially shield are also applied by known techniques.

DETAILED DESCRIPTION OF THE INVENTION

Following are several examples presented to illustrate the present invention. The steps used in each example were the same unless specifically noted otherwise.

The general mode for effecting the processes reported herein was to employ a conventional plasma-generating device surrounding a 6 inch diameter quartz reaction chamber. The plasma was generated employing about 150 watts of power and a frequency of 13.56 megacycles per second.

The specimens to be etched in all cases were thin films of gold on flat, glass plates; and the thin films of gold in all cases were partially covered with a layer of commercial photoresist known as AZ 1350 H and produced by the Shipley Company in the form of a pattern for a printed circuit. The glass plates were about 3 inches in diameter; and a number of such plates, usually about seven or eight, were mounted vertically in a glass boat that held them approximately in the center of the reaction chamber.

When the specimens were in the reaction chamber, the reaction chamber was evacuated to a pressure of about 10 microns, after which the gas employed to produce the plasma was bled into the chamber. The evacuation pump was maintained in operation while gas was introduced, and the rate that gas was introduced was regulated to maintain a dynamic pressure of about 0.15 torr. When sufficient gas had passed through the chamber to insure substantially complete removal of air and when the introduction rate was such that the desired operating pressure was maintained, the electric field was turned on to produce a plasma. The glass plates were subjected to the action of the plasma, usually for a period of about 20 minutes. The specimens were capable of being visually observed during the etching process so that the process could be continued without interruption until etching was complete.

Although glass substrates were used for purposes of illustration, any number of substrates, such as silicon, could be employed without departing from the inventive concept described herein. The substrates were provided with thin films of metal by conventional methods of evaporation, and films of photoresist were coated over the thin metal film, exposed photographically and partially removed according to known procedures.

EXAMPLE I

Employing the techniques described above, a number of specimens were exposed to a plasma of carbon tetrachloride vapors mixed with 20% volume oxygen at a pressure of 0.15 torr. After 20 minutes exposure to the resultant plasma, the specimens were examined, and it was found that no gold was removed but that the photoresist was darkened.

EXAMPLE II

A number of specimens prepared as described above were exposed to a plasma of carbon tetrafluoride containing 20% volume oxygen. After 20 minutes of exposure to the plasma, the specimens were examined. Very little gold was removed and this small amount was removed irregularly. The remaining gold was blackened. The process was unsatisfactory for selective removal or etching of gold.

EXAMPLE III

A number of specimens were subjected to a plasma of a 50—50 mixture of carbon tetrachloride and carbon tetrafluoride containing 20% volume oxygen. Gold was slowly removed from the areas of the glass plate not coated with resist, but it was removed unevenly and the photoresist was attacked in some areas. It is speculated that the poor results obtained in this example were due to difficulty in regulating the flow rates of the gases and to some concentration gradients within the reaction chamber.

EXAMPLE IV

Specimens prepared as set forth above were exposed to a plasma of $CCl_2F_2$. After 20 minutes of exposure to the plasma a significant amount of gold was removed and the photoresist was intact. The gold was removed completely from the edges of the specimen and incompletely from the central portion. It was apparent from observing the action of the plasma on the specimens that with sufficient time all exposed gold would be removed.

EXAMPLE V

The process of Example IV was repeated except 20% volume of oxygen was added to the plasma. After 20 minutes of exposure to the plasma, all of the gold not covered by resist was removed and the resist was intact although darkened. Microscopic examination of the pattern of the gold remaining on the glass revealed a high degree of resolution.

EXAMPLE VI

Specimens prepared as set forth above were exposed to a plasma of $C_2Cl_3F_3$. After about 30 minutes exposure to the plasma, the specimens were removed and microscopic examination revealed that all gold not covered by resist was removed and an exceptionally high degree of resolution of the pattern was obtained.

EXAMPLE VII

The experiment reported in Example VI was repeated using about 25% volume oxygen in the plasma. The rate of etching was increased so that all exposed gold was removed in about 20 minutes. An exceptionally high degree of resolution of the pattern was obtained.

EXAMPLE VIII

Specimens prepared as set forth above were exposed to a plasma of $C_2ClF_5$ containing 25% oxygen. After 30 minutes exposure to the plasma, specimens were examined and found to be only partially etched. It was evident that etching in this plasma is extremely slow and that the uneven etching from the edge toward the center of each specimen would cause a graduation in resolution and other properties if the specimens were subjected to the plasma long enough to complete the etching process.

EXAMPLE IX

Specimens coated with thin films of platinum and tantalum were exposed to a plasma of $CCl_2F_2$ containing 20% oxygen. After 20 minutes all exposed noble metal was removed and microscopic examination of the specimens indicated that a pattern of noble metal with high resolution was obtained.

What is claimed is:

1. A process for etching a noble metal selected from the group consisting of gold, platinum, palladium, and silver comprising exposing said noble metal to a plasma consisting essentially of fluorine, chlorine; and not more than 25% oxygen by volume for a time sufficient to remove the noble metal.

2. The process of claim 1 wherein said plasma is produced from a chlorofluorocarbon compound.

3. The process of claim 2 wherein the atomic ratio of fluorine to chlorine is from about 1:3 to about 3:1.

4. The process of claim 1 wherein etching is effected at a pressure below 0.2 torr.

5. The process of claim 1 wherein etching is effected under a dynamically maintained pressure.

6. The process of claim 1 wherein the noble metal is in the form of a thin film on a substrate.

7. The process for producing an electrically conductive pattern on an electrically nonconductive substrate comprising:

a. forming a film of electrically conductive noble metal selected from the group consisting of gold, platinum, palladium, and silver on an electrically nonconductive substrate, b. providing a film of resist over the film of noble metal with the film of resist covering those areas where the noble metal is to remain and leaving those areas where the noble metal is to be removed uncovered by resist, and c. contacting the exposed noble metal with a plasma consisting essentially of fluorine, chlorine and not more than 25% oxygen by volume for a time sufficient to remove the exposed noble metal.

8. The process of claim 7 wherein said plasma is made from a chlorofluoro carbon.

9. The process of claim 7 wherein the atomic ratio of fluorine to chlorine is from 1:3 to 3:1.

10. The process of claim 7 wherein said plasma is at a pressure below 0.2 torr.

* * * * *